(12) United States Patent
Hoshi et al.

(10) Patent No.: US 7,601,993 B2
(45) Date of Patent: Oct. 13, 2009

(54) SEMICONDUCTOR DEVICE HAVING OHMIC RECESSED ELECTRODE

(75) Inventors: Shinichi Hoshi, Tokyo (JP); Masanori Itoh, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/636,430

(22) Filed: Dec. 11, 2006

(65) Prior Publication Data

US 2007/0132037 A1 Jun. 14, 2007

(30) Foreign Application Priority Data

Dec. 12, 2005 (JP) ............... 2005-357589

(51) Int. Cl.
*H01L 31/072* (2006.01)
(52) U.S. Cl. .................. 257/192; 257/194; 257/272; 257/368; 257/396; 257/E21.407; 257/E21.387; 257/E29.315
(58) Field of Classification Search .......... 257/192, 257/194, 272, 368, 396, E21.407, E21.387, 257/E29.315
See application file for complete search history.

(56) References Cited

U.S. PATENT DOCUMENTS

| | | | | |
|---|---|---|---|---|
| 5,099,295 A | * | 3/1992 | Ogawa | 257/24 |
| 5,436,468 A | * | 7/1995 | Nakata et al. | 257/15 |
| 5,446,296 A | * | 8/1995 | Nakajima | 257/194 |
| 5,561,305 A | * | 10/1996 | Smith | 257/194 |
| 5,818,078 A | * | 10/1998 | Makiyama et al. | 257/281 |
| 5,949,096 A | * | 9/1999 | Ohkubo et al. | 257/192 |
| 6,936,487 B2 | * | 8/2005 | Ikeda et al. | 438/22 |
| 2002/0005528 A1 | * | 1/2002 | Nagahara | 257/189 |
| 2003/0008440 A1 | * | 1/2003 | Udagawa et al. | 438/167 |

OTHER PUBLICATIONS

"Ultra HIgh Speed Compound Semiconductor Devices", edited by M. Omori and supervised by T. Sugano, Baifukan, 6.2 Electrodes Formulation Technology (p. 196-202).
"AlGaN/GaN HEMT's with Recessed Ohmic Electrodes and Si Substrates", K. Kaifu et al., 2005, The Electrochemical Society, ECS Transactions vol. 1, No. 2, pp. 259-265.

* cited by examiner

*Primary Examiner*—Andy Huynh
(74) *Attorney, Agent, or Firm*—Venable LLP; James R. Burdett

(57) ABSTRACT

The present invention provides a semiconductor device having a recess-structured ohmic electrode, in which the resistance is small and variation in the resistance value caused by manufacturing irregularities is small. In the semiconductor device of the present invention, a two-dimensional electron gas layer is formed on the interface between a channel-forming layer and a Schottky layer by electrons supplied from the Schottky layer. The ohmic electrode comprises a plurality of side faces in ohmic contact with the two-dimensional electron gas layer. At least a part of side faces of the ohmic electrodes are non-parallel to a channel width direction. In a preferred embodiment of the present invention, the side faces have a saw tooth form or a comb tooth form. Since the contact area between the ohmic electrode and the two-dimensional electron gas layer is increased, ohmic resistance is reduced.

4 Claims, 8 Drawing Sheets

SEMICONDUCTOR DEVICE HAVING OHMIC RECESSED ELECTRODE

BACKGROUND OF THE INVENTION

1. Field of the Invention

The present invention relates to a technique for reducing the ohmic resistance of an ohmic electrode having a recessed structure and formed in a semiconductor device. The present invention may be applied to the source electrode and drain electrode of a High Electron Mobility Transistor (HEMT), for example.

2. Description of Related Art

In the prior art, a HEMT is known as a type of Field Effect Transistor (FET). A feature of a HEMT is that a current path is formed by a two-dimensional electron gas layer generated on the interface between two types of semiconductor film having different band gaps.

Typically, a HEMT comprises a channel-forming layer formed on a substrate and a Schottky layer formed on the channel-forming layer. Films having different band gaps are used as the channel-forming layer and Schottky layer. For example, a GaN film may be used as the channel-forming layer, and an AlGaN film may be used as the Schottky layer. The two-dimensional electron gas layer is formed on the interface between the channel-forming layer and the Schottky layer.

A cap layer is formed on the surface of the Schottky layer. A source electrode, a drain electrode, and a gate electrode are disposed on the cap layer. The source electrode and drain electrode are ohmic electrodes.

When a potential is applied to the gate electrode, a depletion layer is formed in the two-dimensional electron gas layer. A current flowing between the source electrode and the drain electrode is controlled by the depletion layer. In the two-dimensional electron gas layer, electron mobility is much greater than that of a normal semiconductor. Therefore, the HEMT operates at a higher speed than a typical FET.

To improve the characteristics of the HEMT, contact resistance between the ohmic electrodes and the two-dimensional electron gas layer is preferably reduced.

Ohmic contact resistance between a metal electrode and a semiconductor maybe calculated using the following Equation (1). This calculation method is disclosed in "3. Ultra High Speed Compound Semiconductor Devices", edited by Masamichi Omori and supervised by Takuo Sugano, Baifukan, 6.2 Electrode Formation Technology (p. 196-202).

$$Rc=((\rho c \times \rho\square)^{0.5}/W) \times (1-e^{-L/Le})^{-1} \quad (1)$$

In Equation (1), Rc is ohmic contact resistance (ohm×mm), ρc is contact resistivity (ohm×cm$^2$), ρ☐ is sheet resistance (ohm/sq), W is the gate width, and therefore the ohmic electrode width, and L is the ohmic electrode length. Further, Le is the ohmic electrode length when the current flowing into the ohmic electrodes is 1/e of the entire current.

It is usually believed that if L is 3×Le or more, the ohmic contact resistance can be sufficiently reduced. When L=3×Le, $1-e^{-L/Le}=0.95$. Hence, when L is sufficiently longer than Le, the following Equation (2) is approximately established.

$$Rc=(\rho c \times \rho\square)^{0.5}/W) \quad (2)$$

The value of Le varies according to the sheet resistance and electron mobility of the two-dimensional electron gas layer. For example, when the sheet resistance is 400 Ohm and the electron mobility is 4000 cm$^2$/Vs, Le=1.5 μm. Le increases as the electron mobility of the two-dimensional electron gas layer decreases, and therefore the length L of the ohmic electrodes must be increased. For example, when the channel-forming layer is formed from GaN and the Schottky layer is formed from AlGaN, the electron mobility is approximately 1500 cm$^2$/Vs. Hence, in a HEMT using a hetero-junction of AlGaN and GaN, the source electrode and drain electrode must be made extremely long.

As another technique for reducing ohmic contact resistance between a metal electrode and a semiconductor, a method of alloying the contact surfaces is known. However, when semiconductors having a large energy gap are used, the energy required for alloying is extremely large, and therefore the alloying is difficult. In a HEMT using a hetero-junction of AlGaN and GaN, alloying is essentially impossible.

As a third technique for reducing ohmic contact resistance between a metal electrode and a semiconductor, an ohmic recess structure is known. In an ohmic recess structure, an ohmic electrode is buried in a recess formed in the surface of the semiconductor layer. For example, K. Kaifu et al. 2005 The Electrochemical Society, "AlGaN/GaN HEMTs with Recessed Ohmic Electrodes on Si Substrates", ECS Transactions Vol. 1, No. 2, pp. 259-265 is known as a document which discloses an ohmic recess structure.

K. Kaifu et al. disclose a HEMT employing an ohmic recess in FIG. 2 thereof. As shown in this drawing, an ohmic electrode is buried in a recess formed in a GaN thin film by etching. K. Kaifu et al. reduce ohmic resistance by causing the two-dimensional electron gas layer to contact the bottom surface of the ohmic electrode directly.

However, according to an investigation conducted by the present inventor, the electric resistance of an ohmic contact formed between a semiconductor film and an ohmic electrode cannot be reduced sufficiently with the technique disclosed in K. Kaifu et al. This technique is also disadvantaged in that variation in the ohmic resistance value caused by manufacturing irregularities is large.

SUMMARY OF THE INVENTION

An object of the present invention is to provide a semiconductor device in which the electric resistance of an ohmic contact formed between a semiconductor film and an ohmic electrode can be reduced sufficiently, and in which variation in the ohmic resistance value caused by manufacturing irregularities is small.

To achieve this object, a semiconductor device according to the present invention comprises: a channel-forming layer formed on a semiconductor substrate; a Schottky layer formed on the channel-forming layer; a two-dimensional electron gas layer formed on an interface between the Schottky layer and the channel-forming layer by an electron supplied to the channel-forming layer from the Schottky layer; a gate electrode formed on the Schottky layer via a cap layer; and a recess-structured ohmic electrode containing a plurality of side faces which are in ohmic contact with the two-dimensional electron gas layer and non-parallel to a channel width direction.

BRIEF DESCRIPTION OF THE DRAWINGS

Other objects and advantages of the present invention will be described with reference to the following attached drawings, in which.

DESCRIPTION OF THE PREFERRED EMBODIMENTS

Figure 1:
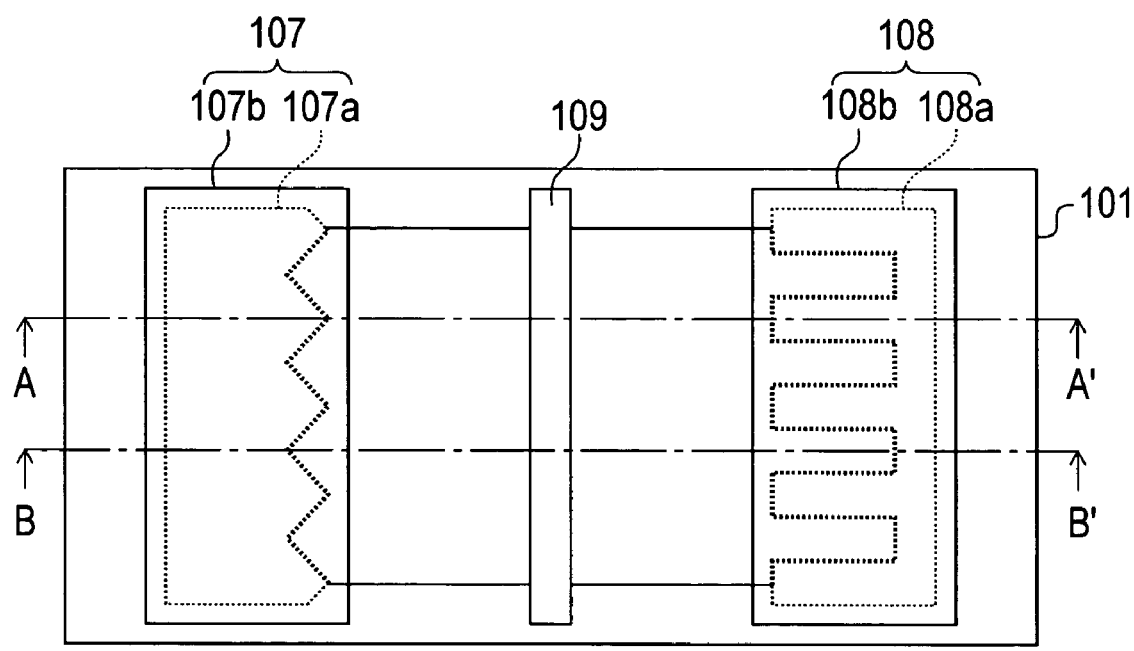
FIG. 1 is a plan view showing an outline of the structure of a semiconductor device according to a first embodiment.

Embodiments of the present invention will be described below using the drawings. In the drawings, the size, shape, and positional relationships of the various constitutional components are illustrated schematically to a degree which facilitates understanding of the present invention, and the numerical conditions described below are merely examples.

First Embodiment

A semiconductor device according to a first embodiment of the present invention will be described below using an example in which the present invention is applied to a GaN-HEMT, or in other words a HEMT using a GaN layer as a semiconductor layer.

Figure 2A:
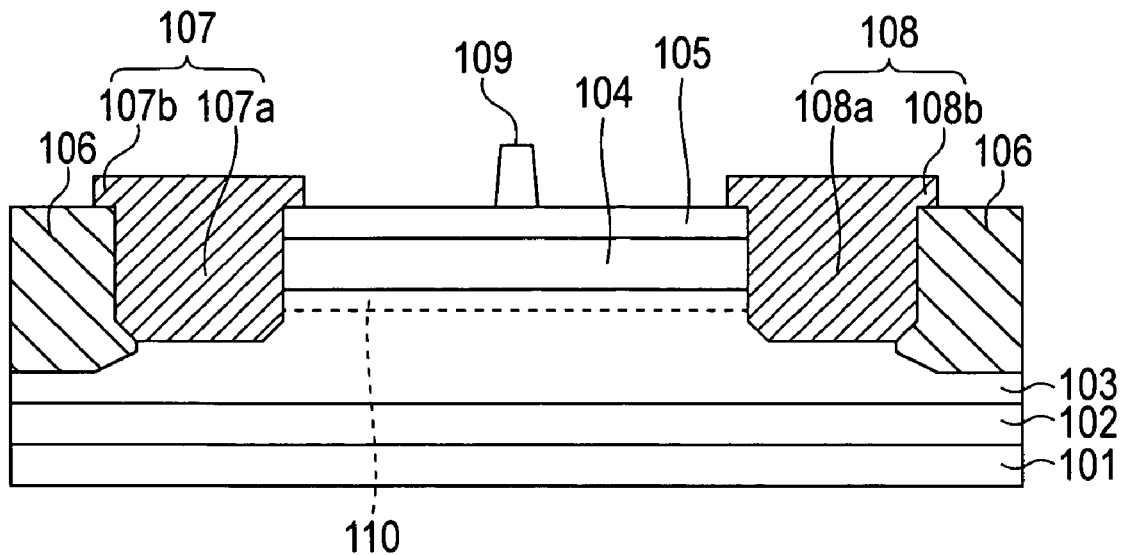
FIG. 2A is an A-A' sectional view of FIG. 1.
Figure 2B:
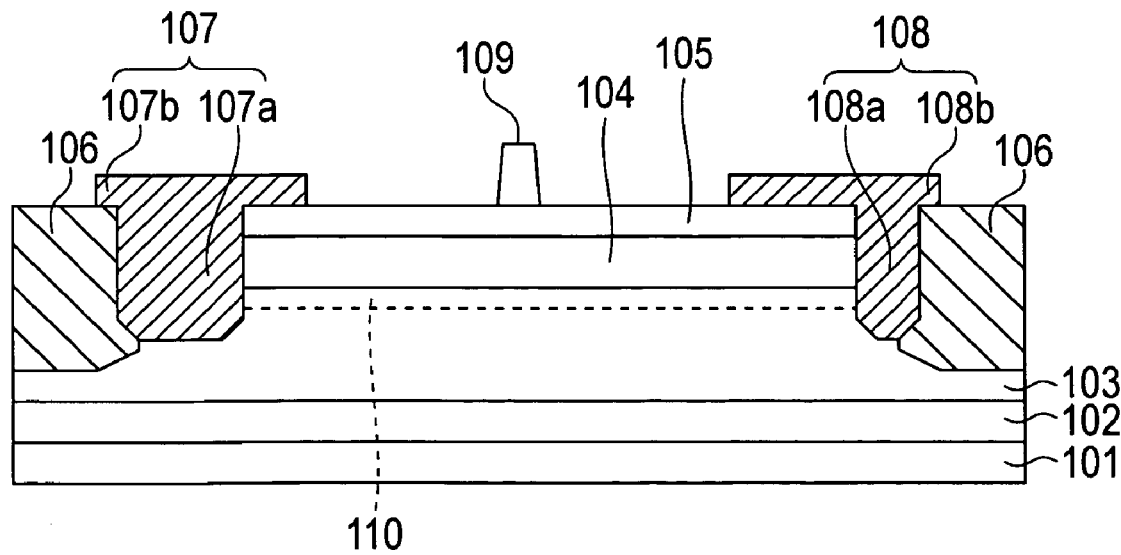
FIG. 2B is a B-B' sectional view of FIG. 1.

FIGS. 1, 2A, and 2B show an outline of the structure of the GaN-HEMT according to this embodiment. FIG. 1 is a plan view, FIG. 2A is an A-A' sectional view of FIG. 1, and FIG. 2B is a B-B' sectional view of FIG. 1.

As shown in FIGS. 1, 2A, and 2B, a GaN-HEMT 100 of this embodiment comprises laminated layers, including a buffer layer 102, a channel-forming layer 103, a Schottky layer 104, and a cap layer 105, formed on a semiconductor substrate 101. An isolation region 106, a source electrode 107, a drain electrode 108, and a gate electrode 109 are formed on the laminated layers.

As the semiconductor substrate 101, a substrate such as an SiC substrate, a sapphire substrate, or a silicon substrate is used, For example.

The buffer layer 102 is a layer for obtaining enough property of the channel-forming layer 103. When the lattice constants of the semiconductor substrate 101 and the channel-forming layer 103 are different, the buffer layer 102 should be formed on the semiconductor substrate 101 to suppress the occur of the dislocation in the channel-forming layer 103. The buffer layer 102 of GaN-HEMT may be formed by depositing GaN, AlGaN, AlN or the like. In the case where the semiconductor layer 101 is made from SiC in which the lattice constant is 3.08 angstrom and the channel-forming layer 103 is formed from GaN in which the lattice constant is 3.189 angstrom, the buffer layer 102 which is formed by depositing GaN at high temperature, and the thickness of which is 2 μm at least, may be employed.

The channel-forming layer 103 is a layer for forming a channel, or in other words a current path. A high-resistance GaN film, for example, may be used as the channel-forming layer 103.

The Schottky layer 104 is a layer for generating electrodes for a two-dimensional electron gas. Since the electrons of the Schottky layer 104 move to the channel-forming layer 103, a two-dimensional electron gas layer 110 is formed on the interface between the layers 103 and 104. The two-dimensional electron gas layer 110 serves as the channel of the HEMT 100. A high-resistance AlGaN film, for example, may be used as the Schottky layer 104.

The cap layer 105 is a layer for preventing oxidation of the Schottky layer 104. The device characteristics of the GaN-HEMT 100 improves by forming the cap layer 105. A GaN film, for example, may be used as the cap layer 105.

The isolation region 106 is formed for separating the GaN-HEMT 100 from other elements formed on the semiconductor substrate 101. The isolation region 106 may be formed by the ion implantation of Ar, N or O, for example.

The source electrode 107 is an ohmic electrode for supplying electrons to the two-dimensional electron gas layer 110. The source electrode 107 comprises a lower portion 107a buried in the laminated layers 103 to 105, and an upper portion 107b exposed on the surface of the layer 105. The drain electrode 108 is an ohmic electrode for receiving electrons from the two-dimensional electron gas layer 110. The drain electrode 108 comprises a lower portion 108a buried in the laminated layers 103 to 105, and an upper portion 108b exposed on the surface of the layer 105. In this embodiment, as will be described below, the source electrode 107 and drain electrode 108 are formed by laminating together a titanium film and an aluminum film. The thickness of the titanium film is 15 nm, for example, and the thickness of the aluminum film is 100 nm, for example. As shown in FIGS. 1, 2A, and 2B, the electrodes 107, 108 are formed to deeper positions than the two-dimensional electron gas layer 110. As a result, the respective side faces of the electrodes 107, 108 can be brought into direct contact with the two-dimensional electron gas layer 110. Further, the electrodes 107, 108 may be disposed in direct contact with the isolation region 106. The side of each of the electrodes 107, 108 which contacts the two-dimensional electron gas layer 110, i.e. the side which faces the other electrode, comprises a plurality of faces that are non-parallel to the channel direction. In this embodiment, the contact side between the source electrode 107 and the two-dimensional electron gas layer 110 has a saw tooth form, while the contact surface between the drain electrode 108 and the two-dimensional electron gas layer 110 has a comb tooth form. Both of the electrodes 107, 108 may take saw tooth forms and both of the electrodes 107, 108 may take comb tooth forms. Other non-planar forms such as a waveform, for example, maybe employed. The effects of the present invention can be obtained using any form, as long as the contact area between the electrodes 107, 108 and the two-dimensional electron gas layer 110 is greater than that of a planar form. There are no limitations on the pitch of the saw tooth form and comb tooth form. For example, if the gate length is 1 μm, the pitch may be set at 1 μm.

The gate electrode 109 is an electrode for forming a depletion layer in the two-dimensional electron gas layer 110. The ON/OFF status or the drain current value of the HEMT 100 is controlled by the depletion layer. The gate electrode 109 is formed by laminating together a nickel film and a gold film, for example.

Figure 3A:
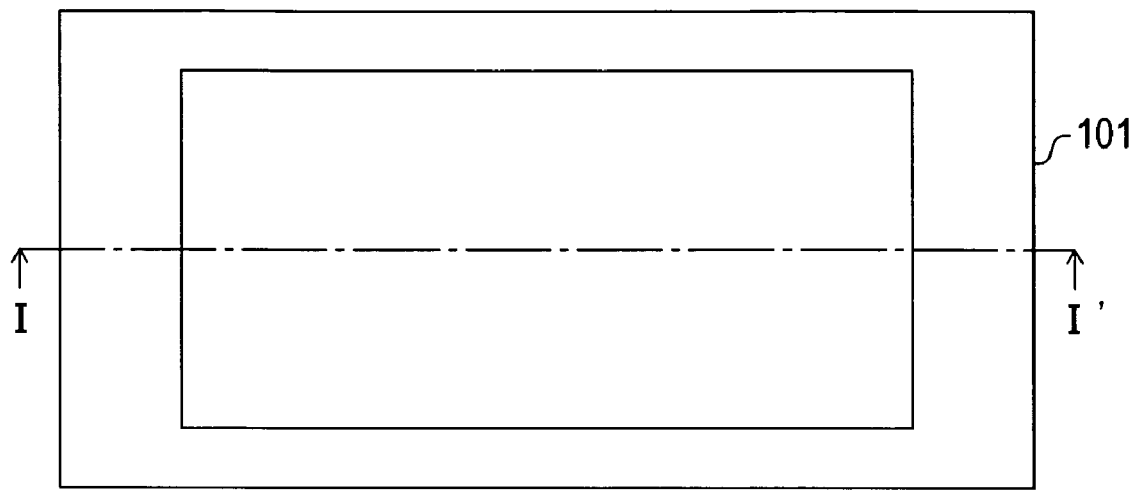
FIG. 3A is a plan view illustrating a manufacturing process for the semiconductor device according to the first embodiment.
Figure 3B:
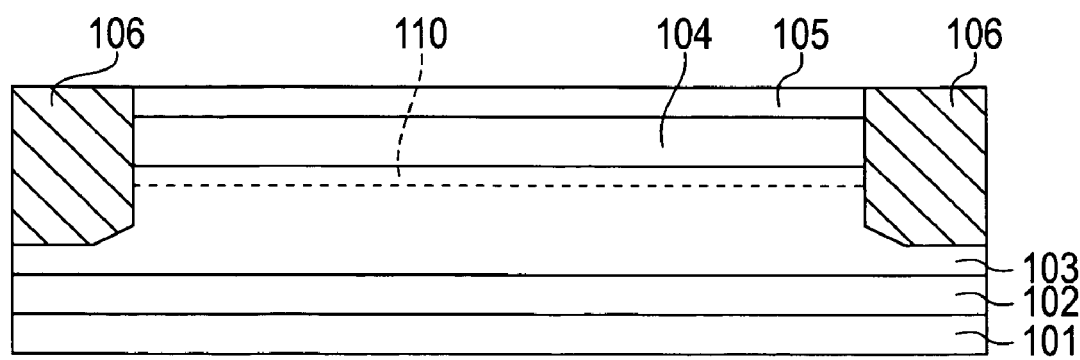
FIG. 3B is an I-I' sectional view of FIG. 3A.
Figure 4A:
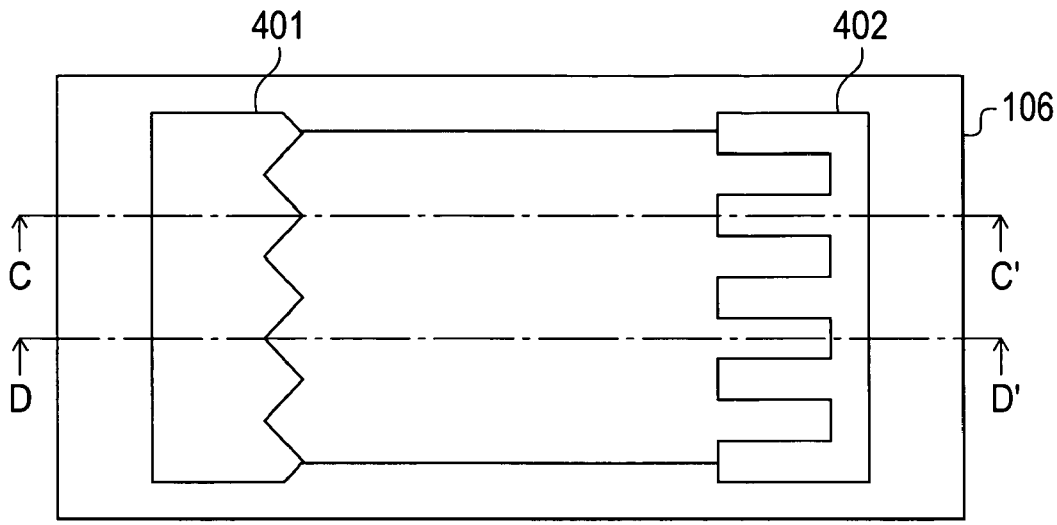
FIG. 4A is a plan view illustrating the manufacturing process for the semiconductor device according to the first embodiment.
Figure 4B:
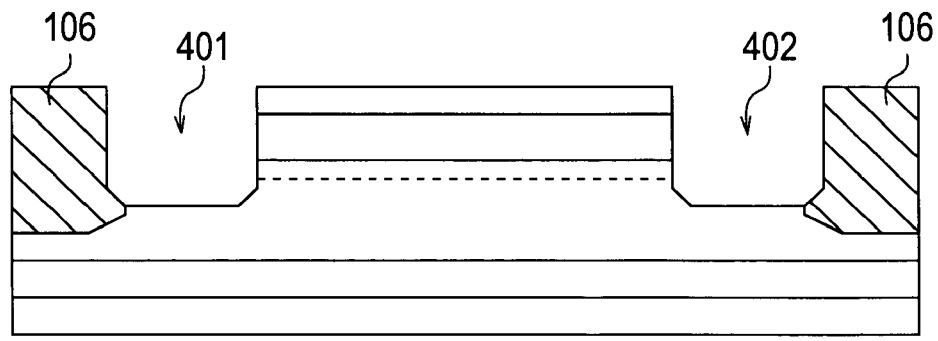
FIG. 4B is a C-C' sectional view of FIG. 4A.
Figure 4C:
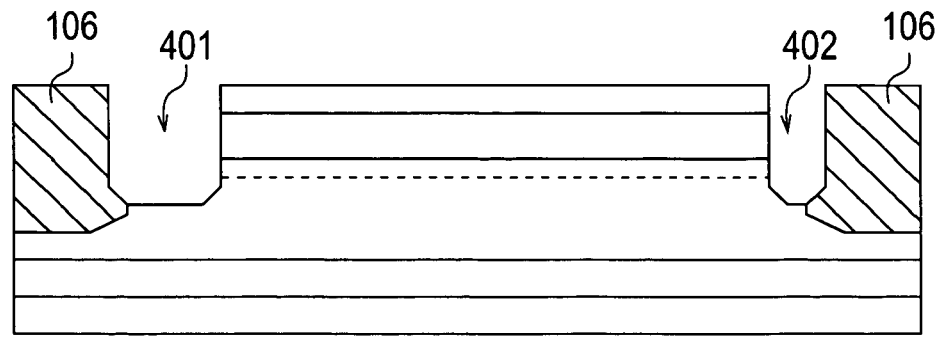
FIG. 4C is a D-D' sectional view of FIG. 4A.
Figure 5A:
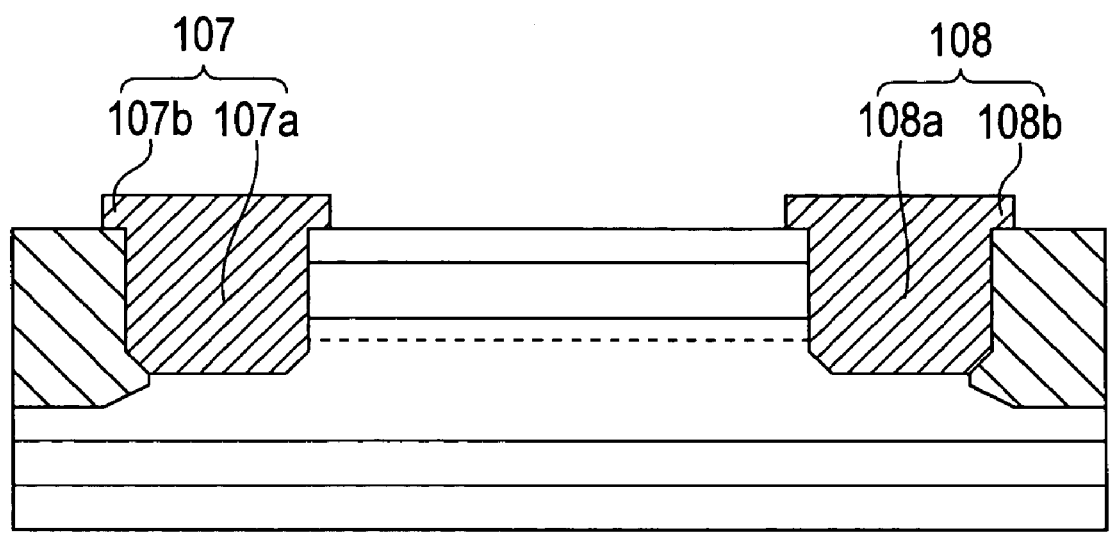
FIGS. 5A and 5B are sectional views illustrating the manufacturing process for the semiconductor device according to the first embodiment.
Figure 5B:
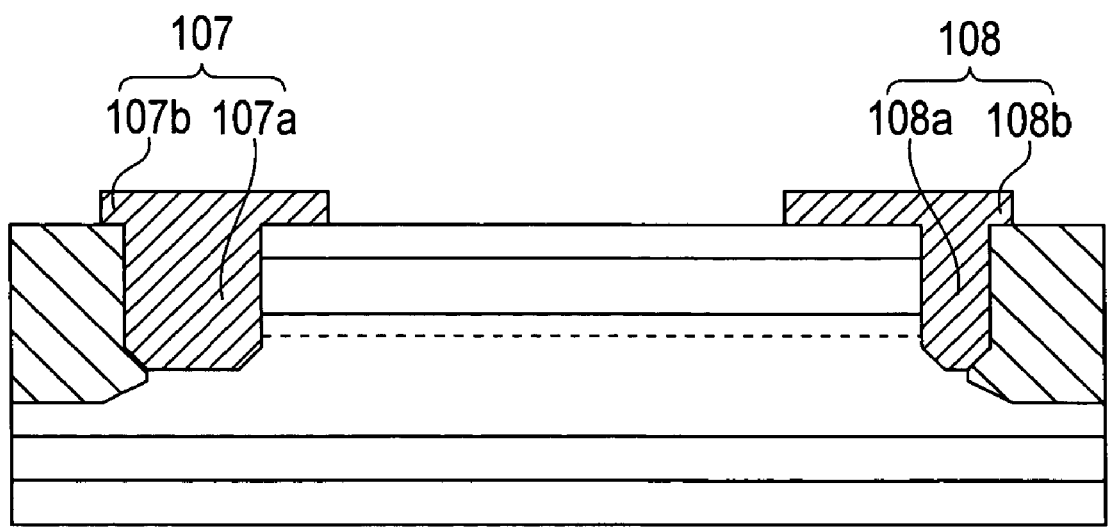

A manufacturing process for the HEMT 100 according to the present embodiment will now be described. FIGS. 3A to 5B are views illustrating the manufacturing process for the HEMT 100 according to the present embodiment. FIG. 3A is a plan view, FIG. 3B is an I-I' sectional view of FIG. 3A, FIG. 4A is a plan view, FIG. 4B is a C-C' sectional view of FIG. 4A, and FIG. 4C is a D-D' sectional view of FIG. 4A. FIG. 5A is a sectional view corresponding to FIG. 4B, and FIG. 5B is a sectional view corresponding to FIG. 4C.

First, using a normal thin film formation technique, the buffer layer 102, channel-forming layer 103, Schottky layer 104, and cap layer 105 are formed on the semiconductor substrate 101, and then, using a ion implantation and other techniques, for example, the isolation region 106 is formed (see FIGS. 3A and 3B).

Next, a resist pattern, not shown in the drawing, is formed using a normal photolithography method. Recesses 401, 402 are then formed in the surface of the substrate 101 by etching using the resist pattern as a mask. The recesses 401, 402 are formed to deeper positions than the two-dimensional electron gas layer 110. In a typical HEMT, the depth of the recesses 401, 402 is approximately 50 nm at most. Moreover, the recesses 401, 402 are formed indirect contact with the isolation region 106. The right side of the recess 401, i.e. the side opposing the recess 402, is formed in a saw tooth shape, while the left side of the recess 402, i.e. the side opposing the recess 401, is formed in a comb tooth shape. Inductive Coupled Plasma Reactive Ion Etching (ICP-RIE) is preferably employed as the etching method. The reason for this is that with this etching technique, damage to the two-dimensional electron gas layer 110 is small. The etching may be performed using $BCl_3$ as an etching gas under the following conditions.

Etching gas flow rate: 20 sccm
Gas pressure: 40 mTorr
Power of Inductive Coupled Plasma: 50 watts
Power of Reactive Ion Etching: 30 watts
Frequency: 13.56 megahertz
Etching time: 10 to 15 minutes The resist pattern is then removed, whereby the formation process of the recesses 401, 402 is complete (see FIGS. 4A, 4B, and 4C).

Next, the source electrode 107 and drain electrode 108 are formed in the recesses 401, 402. In this embodiment, the electrodes 107, 108 are formed using a lift-off method. In this lift-off process, first a resist pattern exposing the recesses 401, 402 and the periphery thereof is formed using a normal photolithography method.

Next, a titanium film and an aluminum film are formed consecutively in the recesses 401, 402 and the periphery thereof by vacuum deposition using the resist pattern as a mask. As described above, the thickness of the titanium film is 15 nm, for example, while the thickness of the aluminum film is 100 nm, for example. The electrodes 107, 108 are preferably formed with flat upper faces. The reason for this is that if hollows exist on the upper face of the electrodes 107, 108, a malfunction is more likely to occur in the HEMT.

The resist pattern is then removed.

If necessary, the substrate 101 is then subjected to heat treatment in a nitrogen atmosphere. In this heat treatment, the heating temperature is 600° C., for example, and the heating time is two minutes, for example. Following the heat treatment, the formation process of the source electrode 107 and drain electrode 108 is complete (see FIGS. 5A and 5B).

Next, the gate electrode 109 is formed on the cap layer 105 using a lift-off method. In this lift-off process, first a resist pattern exposing only the formation region of the gate electrode 109 is formed on the cap layer 105 using a normal photolithography method. The gate electrode 109 is preferably formed in the center of a region sandwiched between the electrodes 107, 108. Accordingly, the resist pattern is formed so as to expose only the center of the region between the electrodes 107, 108.

Next, a nickel film and a gold film are formed consecutively by vacuum deposition using the resist pattern as a mask.

The resist pattern is then removed.

If necessary, the substrate 101 is then subjected to heat treatment in a nitrogen atmosphere. In this heat treatment, the heating temperature is 400° C., for example, and the heating time is two minutes, for example. Following the heat treatment, the HEMT 100 shown in FIGS. 1, 2A, and 2B is complete.

In the HEMT 100 according to this embodiment, as described above, the contact surface between the source electrode 107 and the two-dimensional electron gas layer 110 is formed in a saw tooth shape, and the contact surface between the drain electrode 108 and two-dimensional electron gas layer 110 is formed in a comb tooth shape. Hence, this embodiment is capable of providing the HEMT 100, in which the practical gate width is increased beyond that of a conventional HEMT without altering the size of the HEMT. In other words, with the HEMT 100 of this embodiment, the value of the gate width W in Equation (1) is greater than that of a conventional HEMT. Thus, this embodiment is capable of providing the HEMT 100, in which the ohmic resistance of the source electrode 107 and drain electrode 108 is small.

In addition, with the HEMT 100 of this embodiment, the bottom faces of the ohmic electrodes do not have to contact the two-dimensional electron gas layer, and therefore variation in the ohmic resistance value caused by manufacturing irregularities is small.

Second Embodiment

Next, a semiconductor device according to a second embodiment of the present invention will be described using an example in which the present invention is applied to a GaN-HEMT, or in other words a HEMT using a GaN layer as a semiconductor layer.

Figure 6:
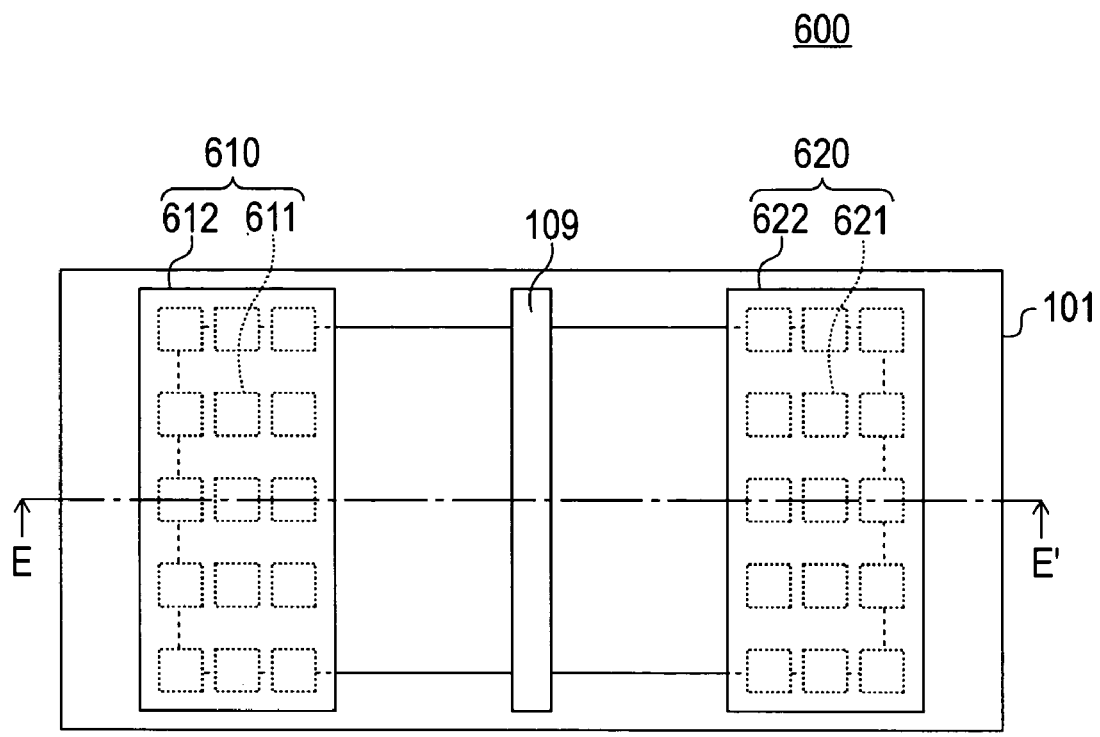
FIG. 6 is a plan view showing an outline of the structure of a semiconductor device according to a second embodiment.
Figure 7:
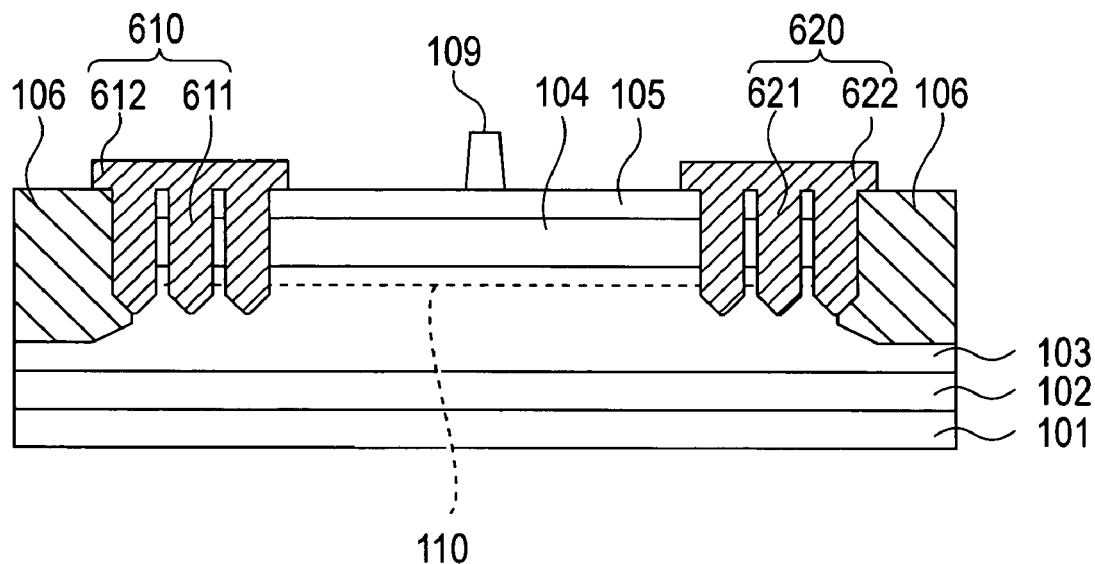
FIG. 7 is an E-E' sectional view of FIG. 6.

FIGS. 6 and 7 show an outline of the structure of the GaN-HEMT according to this embodiment. FIG. 6 is a plan view, and FIG. 7 is an E-E' sectional view of FIG. 6. In FIGS. 6 and 7, constitutional elements having identical reference numerals to those of FIGS. 1 to 2B are identical to the corresponding elements in FIGS. 1 to 2B.

As is evident from FIGS. 6 and 7, a HEMT 600 according to this embodiment differs from the HEMT 100 according to the first embodiment in the structure of the source electrode and drain electrode.

A source electrode 610 and a drain electrode 620 are ohmic electrodes. The source electrode 610 comprises a plurality of lower portion electrodes 611 and a single upper portion electrode 612. Similarly, the drain electrode 620 comprises a plurality of lower portion electrodes 621 and a single upper portion electrode 622. The lower portion electrodes 611, 621 are buried in the laminated films formed on the substrate 101. The upper portion electrode 612 is electrically connected to all of the lower portion electrodes 611, and similarly, the upper portion electrode 622 is electrically connected to all of the lower portion electrodes 621. As shown in FIG. 7, the lower portion electrodes 611, 621 are formed to deeper positions than the two-dimensional electron gas layer 110. As a result, the side faces of the lower portion electrodes 611, 621 can be brought into direct contact with the two-dimensional electron gas layer 110. The lower portion electrodes 611, 621 may directly contact the isolation region 106. The lower portion electrodes 611, 621 are formed in a columnar form such as a square column or circular column, for example. The effects of the present invention can be obtained using any form, as long as the contact area between the electrodes 610, 620 and the two-dimensional electron gas layer 110 is greater than that of a conventional HEMT. There are no limitations on the pitch of the lower portion electrodes 611, 621. For example, if the gate length is 1 μm, the pitch may be set at 1 μm. The lower portion electrodes 611, 621 do not have to be disposed in a matrix form or at fixed intervals. In this embodiment, the source electrode 610 and drain electrode 620 are formed by laminating together a titanium film and an aluminum film. The thickness of the titanium film is 15 nm, for example, and the thickness of the aluminum film is 100 nm, for example.

Figure 8A:
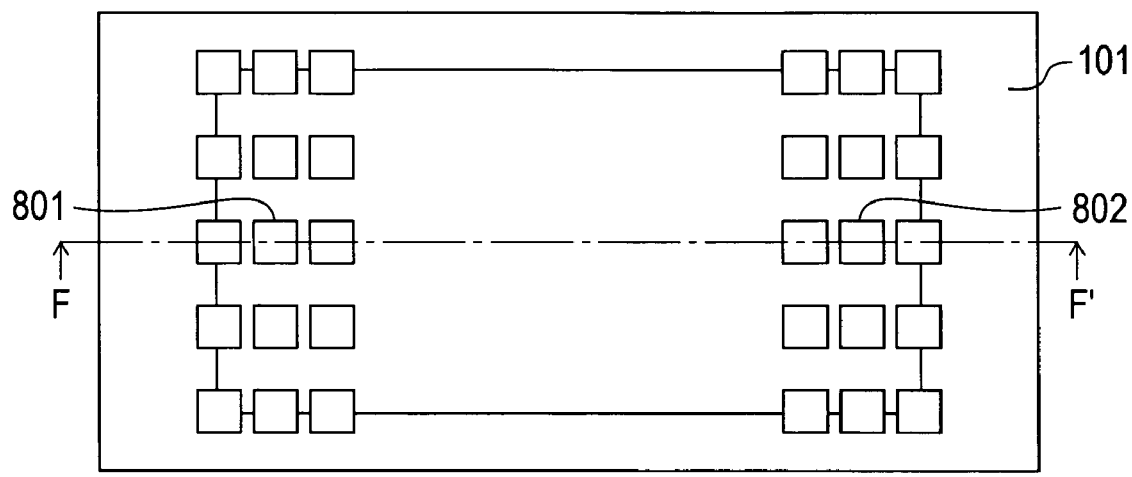
FIG. 8A is a plan view illustrating a manufacturing process for the semiconductor device according to the second embodiment.

A manufacturing process for the HEMT 600 according to this embodiment will now be described. FIGS. 8A to 9 are views illustrating the manufacturing process for the HEMT 600 according to this embodiment. FIG. 8A is a plan view, FIG. 8B is an F-F' sectional view of FIG. 8A, and FIG. 9 is a sectional view corresponding to FIG. 8B.

First, similarly to the first embodiment, the buffer layer 102, channel-forming layer 103, Schottky layer 104, and cap layer 105 are formed on the semiconductor substrate 101 using a normal thin film formation technique, and then, using a ion implantation and other techniques, for example, the isolation region 106 is formed.

Next, a resist pattern is formed using a normal photolithography method. A plurality of recesses 801, 801, . . . and a plurality of recesses 802, 802, . . . are then formed in the surface of the substrate 101 by etching using the resist pattern as a mask. The recesses 801, 802 are formed to deeper positions than the two-dimensional electron gas layer 110. In a typical HEMT, the depth of the recesses 801, 802 is approximately 50 nm at most. The etching method and conditions may be identical to those of the first embodiment.

Figure 8B:
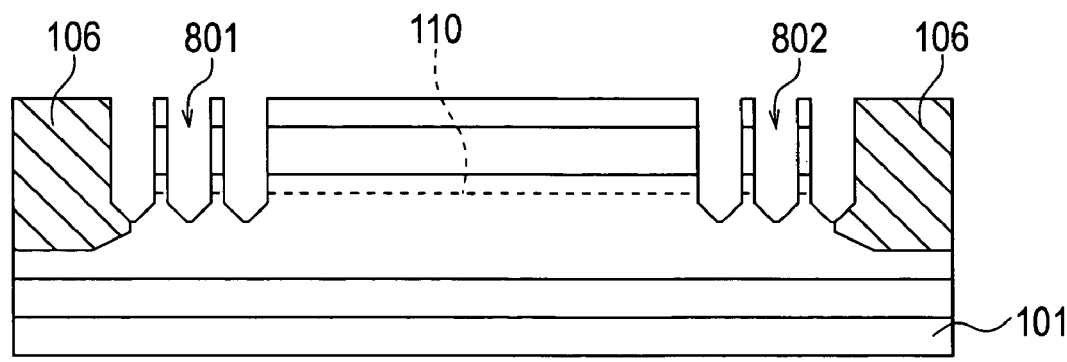
FIG. 8B is an F-F' sectional view of FIG. 8A.
Figure 9:
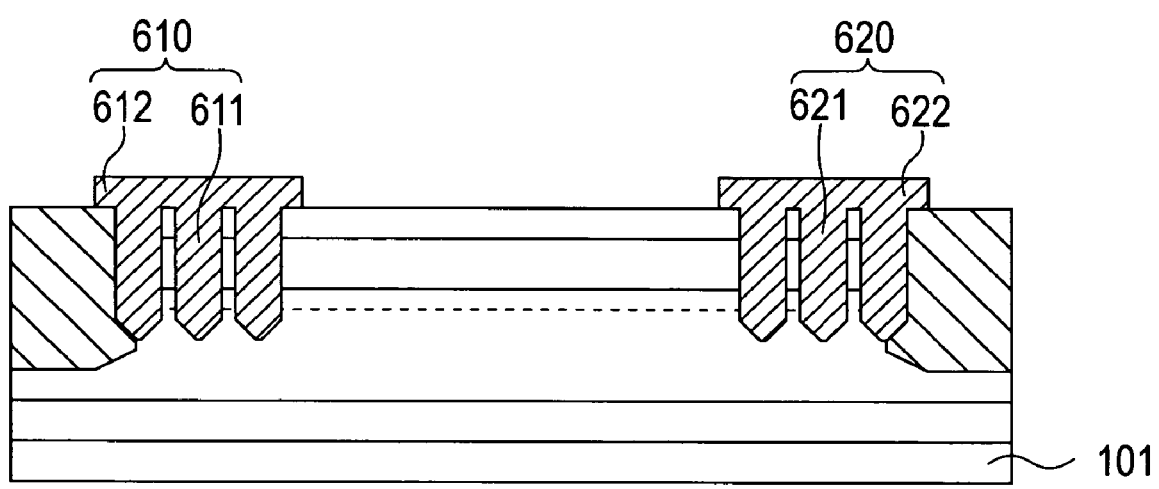
FIG. 9 is a sectional view illustrating the manufacturing process for the semiconductor device according to the second embodiment.

The resist pattern is then removed, whereby the formation process of the recesses 801, 802 is complete (see FIGS. 8A and 8B).

Next, the source electrode 610 and drain electrode 620 are formed in the recesses 801, 802 using a lift-off method. In the lift-off process, first a resist pattern exposing the recesses 801, 802 and the periphery thereof is formed using a normal photolithography method.

Next, a titanium film and an aluminum film are formed consecutively in the recesses 801, 802 and the periphery thereof by vacuum deposition using the resist pattern as a mask. As described above, the thickness of the titanium film is 15 nm, for example, while the thickness of the aluminum film is 100 nm, for example. The lower portion electrodes 611, 621 and the upper portion electrodes 612, 622 are formed simultaneously in a single step. The upper portion electrodes 612, 622 are preferably formed with flat upper faces. The reason for this is that if recesses exist on the upper face of the upper portion electrodes 612, 622, a malfunction is more likely to occur in the HEMT.

The resist pattern is then removed.

If necessary, the substrate 101 is then subjected to heat treatment in a nitrogen atmosphere. In this heat treatment, the heating temperature is 600° C., for example, and the heating time is two minutes, for example. Following the heat treatment, the formation process of the source electrode 610 and drain electrode 620 is complete (see FIG. 9).

Next, the gate electrode 109 is formed on the cap layer 105 using a lift-off method. In this lift-off process, first a resist pattern exposing only the formation region of the gate electrode 109 is formed on the cap layer 105 using a normal photolithography method. The gate electrode 109 is preferably formed in the center of a region sandwiched between the electrodes 610, 620. Accordingly, the resist pattern is formed so as to expose only the center of the region between the electrodes 610, 620.

Next, a nickel film and a gold film are formed consecutively by vacuum deposition using the resist pattern as a mask.

The resist pattern is then removed.

If necessary, the substrate 101 is then subjected to heat treatment in a nitrogen atmosphere. In this heat treatment, the heating temperature is 400° C., for example, and the heating time is two minutes, for example. Following the heat treatment, the HEMT 600 shown in FIGS. 8A to 9 is complete.

As described above, the ohmic electrodes 610, 620 according to this embodiment comprise the plurality of columnar lower portion electrodes 611, 621, respectively. Hence, the contact area between the ohmic electrodes 610, 620 and the two-dimensional electron gas layer 110 is even larger than that of the HEMT 100 according to the first embodiment. As a result, this embodiment is capable of providing a HEMT in which ohmic resistance is even smaller than that of the first embodiment. For example, when L=3×Le in Equation (1) (i.e. when Equation (2) is established), the ohmic resistance is approximately one third that of a conventional HEMT.

Moreover, in the HEMT 600 of this embodiment, similarly to the HEMT 100 of the first embodiment, the bottom faces of the ohmic electrodes do not have to be brought into contact with the two-dimensional electron gas layer, and therefore variation in the ohmic resistance value caused by manufacturing irregularities is small.

What is claimed is:

1. A semiconductor device comprising:
    a channel-forming layer formed on a semiconductor substrate;
    a Schottky layer formed on said channel-forming layer;
    a two-dimensional electron gas layer formed on an interface between said Schottky layer and said channel-forming layer by an electron supplied to said channel-forming layer from said Schottky layer;
    a gate electrode formed on said Schottky layer via a cap layer; and
    a recess-structured ohmic electrode containing a plurality of side faces which are in ohmic contact with said two-dimensional electron gas layer and non-parallel to a channel width direction;
    wherein said ohmic electrode comprises a plurality of lower portion electrodes formed in a columnar shape, and an upper portion electrode formed so as to be electrically connected to all of said lower portion electrodes.

2. The semiconductor device according to claim 1, wherein said lower portion electrodes are disposed in a matrix form.

3. The semiconductor device according to claim 1, wherein said lower portion electrodes are square columns.

4. The semiconductor device according to claim 1, wherein said lower portion electrodes are circular columns.

* * * * *